United States Patent
Fujiki et al.

(10) Patent No.: US 6,677,682 B1
(45) Date of Patent: Jan. 13, 2004

(54) MULTILAYER INTERCONNECTION STRUCTURE INCLUDING AN ALIGNMENT MARK

(75) Inventors: Noriaki Fujiki, Tokyo (JP); Shigeru Harada, Tokyo (JP); Takashi Yamashita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 3 days.

(21) Appl. No.: 09/620,555

(22) Filed: Jul. 20, 2000

(30) Foreign Application Priority Data

Jan. 28, 2000 (JP) ..................... P2000-020309

(51) Int. Cl.⁷ .......................................... H01L 23/544
(52) U.S. Cl. ........................................ 257/797
(58) Field of Search ................. 257/797, 750, 257/752, 756, 758; 438/401, 462

(56) References Cited

U.S. PATENT DOCUMENTS

| | | | | |
|---|---|---|---|---|
| 3,641,402 A | * | 2/1972 | Revitz et al. | 317/234 |
| 4,001,871 A | * | 1/1977 | Tsunemitsu | 357/54 |
| 4,920,403 A | * | 4/1990 | Chow et al. | 357/71 |
| 5,786,260 A | * | 7/1998 | Jang et al. | 438/401 |
| 5,795,495 A | | 8/1998 | Meikle | |
| 5,985,764 A | * | 11/1999 | Lin et al. | 438/692 |
| 6,010,945 A | * | 1/2000 | Wu | 438/401 |
| 6,023,099 A | * | 2/2000 | Komuro | 257/758 |
| 6,127,737 A | * | 10/2000 | Kuroi et al. | 257/797 |
| 6,133,641 A | * | 10/2000 | Hamada et al. | 257/797 |
| 6,215,129 B1 | * | 4/2001 | Harvey et al. | 257/48 |
| 6,271,602 B1 | * | 8/2001 | Ackmann et al. | 257/797 |
| 6,274,940 B1 | * | 8/2001 | Baker et al. | 257/797 |
| 6,288,454 B1 | * | 9/2001 | Allman et al. | 257/797 |
| 6,290,631 B2 | * | 9/2001 | Chu et al. | 488/692 |
| 6,344,697 B2 | * | 2/2002 | Sugiyama | 257/797 |
| 6,495,928 B1 | * | 12/2002 | Hashizume et al. | 257/797 |

FOREIGN PATENT DOCUMENTS

| | | |
|---|---|---|
| JP | 9-199588 | 7/1997 |
| JP | 9-232207 | 9/1997 |

\* cited by examiner

*Primary Examiner*—Steven Loke
*Assistant Examiner*—Douglas W. Owens
(74) *Attorney, Agent, or Firm*—Oblon, Spivak, McClelland, Maier & Neustadt, P.C.

(57) ABSTRACT

An interlayer insulating film (21) is formed on a substrate (1), and a polysilicon layer (10) is formed on the interlayer insulating film (21). An interlayer insulating film (22) is formed to cover the polysilicon layer (10), and a polysilicon layer (11) is formed on the interlayer insulating film (22). An interlayer insulating film (23) is formed to cover the interlayer insulating film (22). A hole (20M) for a mark to constitute an alignment mark or the like is formed from a surface (23S) of the interlayer insulating film (23) to the polysilicon layer (11). The hole (20M) for a mark is larger than a contact hole formed from the surface (23S) to the substrate (1) but is shallower than the contact hole. Consequently, a concave portion corresponding to the hole (20M) for a mark is formed, with difficulty, on a silicon oxide layer to be subjected to CMP polishing and then become an interlayer insulting film (4). Therefore, it is possible to prevent a slurry from remaining in the concave portion. Thus, it is possible to obtain a semiconductor device having high reliability without a disadvantage such as a wiring disconnection or the like which is caused by the remaining or scattering of the slurry to be used for a CMP method.

5 Claims, 12 Drawing Sheets

F I G . 12
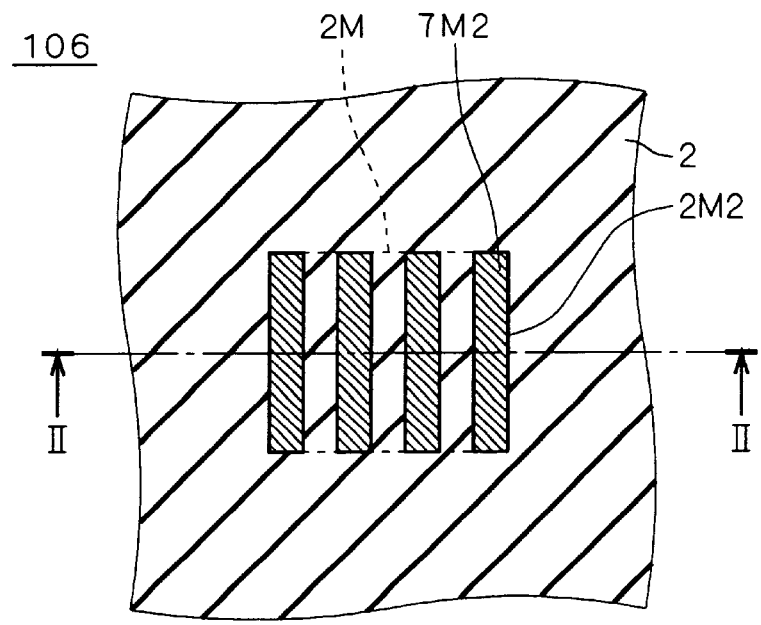
F I G . 13
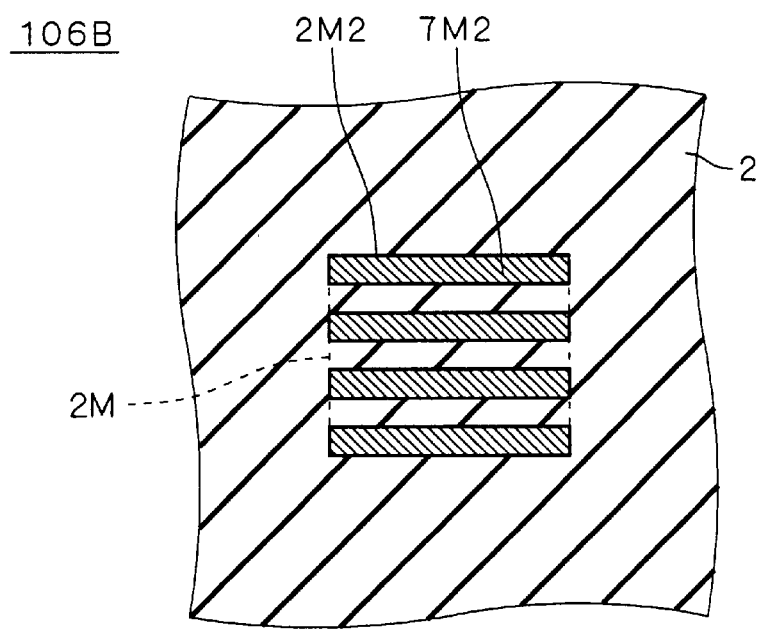

MULTILAYER INTERCONNECTION STRUCTURE INCLUDING AN ALIGNMENT MARK

BACKGROUND OF THE INVENTION

1. Field of the Invention

The present invention relates to a semiconductor device and a method of manufacturing the semiconductor device, and more particularly to a multilayer interconnection technique.

2. Description of the Background Art

In recent years, a wiring has become finer and more multilayered with an enhancement in the integration and function of a semiconductor device. In a method of manufacturing the semiconductor device, a multilayer interconnection technique has been one of important techniques.

FIG. 17 is a longitudinal sectional view illustrating a conventional semiconductor device 101P having a two-layer interconnection structure. The semiconductor device 101P comprises a silicon substrate 1P. In FIG. 17, various elements formed on a surface of the silicon substrate 1P are omitted.

An interlayer insulating film 2P composed of a silicon oxide ($SiO_2$) is formed on the silicon substrate 1P. The interlayer insulating film 2P is provided with a contact hole 2HP in a direction of a thickness thereof and a hole 2MP for a mark such as an alignment mark. In a semiconductor device having a minimum line width of 0.25 $\mu$m, that is, a so-called quarter micron generation semiconductor device, generally, in the case in which the semiconductor device 101P is seen from an upper surface, the contact hole 2HP and a via hole 4HP which will be described below have dimensions of approximately 0.3 to 0.4 $\mu$m and the hole 2MP for a mark has a dimension of approximately 1 to 10 $\mu$m.

A metal layer 7HP forming a so-called plug is buried in the contact hole 2HP. The "plug" means a conductive layer for electrically connecting conductive layers such as wirings provided with an interlayer insulating film interposed therebetween. On the other hand, a metal layer 7MP having the shape of a so-called side-wall spacer is formed on a side wall of the hole 2MP for a mark. The metal layer 7MP is formed of the same material as the material of the metal layer 7HP.

Furthermore, a metal layer 3HP constituting a wiring or a wiring layer is formed on the interlayer insulating film 2P in contact with the plug 7HP. On the other hand, a metal layer 3MP is formed to cover the hole 2MP for a mark.

An interlayer insulating film 4P composed of a silicon oxide is formed to cover the wiring 3HP, the metal layer 3MP and the interlayer insulating film 2P. The interlayer insulating film 4P has a thickness of approximately 700 to 1000 nm (7000 to 10000 angstrom), for example. The interlayer insulating film 4P has a contact hole or a via hole 4HP reaching the wiring 3HP and the via hole 4HP is filled with a plug 8HP. A wiring 6HP is formed on the interlayer insulating film 4P in contact with the plug 8HP. On the other hand, a concave portion 4MP is formed above the hole 2MP for a mark on the surface 4SP side of the interlayer insulating film 4P which is opposite to the substrate 1.

In FIG. 17, a region HP including the plugs 7HP and 8HP, the wirings 3HP and 6HP and the like is equivalent to an element region or an element formation region where various elements (not shown) of the semiconductor device 101P are formed. On the contrary, a region MP including the hole 2MP for a mark is equivalent to a region where an auxiliary pattern such as an alignment mark to be used in a manufacturing process is formed.

Next, a method of manufacturing the conventional semiconductor device 101P will be described below with reference to each of longitudinal sectional views of FIGS. 18 to 20 in addition to FIG. 17.

First of all, a silicon oxide (plasma oxide) is deposited, by a plasma CVD (Chemical Vapor Deposition) method, on a silicon substrate 1P where the above-mentioned various elements are formed. The silicon oxide is flattened by using an etch-back method or a CMP (Chemical Mechanical Polishing) method, thereby forming an interlayer insulating film 2P.

Next, the interlayer insulating film 2P is wholly coated with a resist (not shown). The resist is patterned to have such a pattern as to correspond to a contact hole 2HP, a hole 2MP for a mark and the like by a photolithographic technique. By a RIE (Reactive Ion Etching) method using the patterned resist as a mask, the interlayer insulating film 2P is opened to form the contact hole 2HP and the hole 2MP for a mark. Then, the resist is removed by an oxygen plasma or the like.

Subsequently, a predetermined metal material is deposited by a sputtering method, for example, to cover the whole interlayer insulating film 2P. Then, the metal layer is etched back to form a plug 7HP. At this time, the dimension of the hole 2MP for a mark is greater than that of the contact hole 7HP as described above. In the hole 2MP for a mark, therefore, the metal layer remains in the form of a side-wall spacer, thereby constituting a metal layer 7MP.

Then, a predetermined metal material is deposited to cover the whole interlayer insulating film 2HP. Thereafter, the whole metal layer is coated with a resist (not shown). The resist is patterned to have such a pattern as to correspond to a wiring 3HP and a metal layer 3MP by a photolithographic technique. Then, the metal layer is patterned to form the wring 3HP and the metal layer 3MP by a RIE method using the patterned resist as a mask. Subsequently, the resist is removed by the oxygen plasma or the like. By the above-mentioned steps, a semiconductor device in the state shown in FIG. 18 is obtained.

As shown in FIG. 19, then, a silicon oxide film 4AP having a thickness of approximately 1500 to 2500 nm (15000 to 25000 angstrom), for example, is formed by using a plasma CVD method to wholly cover the interlayer insulating film 2P, the wiring 3HP and the metal layer 3MP.

The silicon oxide film 4AP is formed to have a concave portion 4MAP corresponding to the concave shape of the hole 2MP for a mark above the hole 2MP for a mark. Such a concave portion 4MAP is easily formed above the comparatively large hole 2MP for a mark as in the case in which the hole 2MP for a mark in a plane view of the silicon substrate 1P has a dimension of approximately 1 $\mu$m or more, for example. Moreover, in the case in which the hole 2MP for a mark has such a depth as to exceed 1.5 $\mu$m, for example, the concave portion is easily formed deeply.

Next, the silicon oxide film 4AP is polished and flattened by using the CMP method to form an interlayer insulating film 4P shown in FIG. 20. In this case, the silicon oxide film provided on the wiring 3HP is polished to have a thickness of approximately 700 to 1000 nm as described above. A bottom part of the concave portion 4MAP shown in FIG. 19 remains as the concave portion 4MP shown in FIG. 20.

In the case in which the silicon oxide is polished by using the CMP method, a silica ($SiO_2$) or ceria ($CeO_2$) based slurry is often used. In respect of productivity, the ceria based slurry having a higher polishing rate is often selected.

Then, a via hole 4HP, a plug 8HP and a wiring 6HP are formed by the same forming method as the method of forming the contact hole 2HP and the like described above. By the above-mentioned steps, the semiconductor device 101P shown in FIG. 17 is obtained. In the case of a multilayer wiring having three layers or more, the above-mentioned steps are repeated predetermined times.

Thereafter, an interlayer insulating film is formed to cover an uppermost wiring, and a silicon nitride film to be a passivation film is formed over the whole surface of the interlayer insulating film by the plasma CVD method or the like. Subsequently, the interlayer insulating film and the like provided on a bonding pad (not shown) are removed by using a photolithographic technique and a dry etching method, thereby exposing the bonding pad.

In the case in which the silicon oxide is polished by using the CMP method as described above, the ceria based slurry having a high polishing rate is often used. At this time, the CMP method using the ceria based slurry includes a polishing step A using the ceria based slurry, a first washing step B of washing the ceria based slurry remaining on a polished surface after the polishing with water and a brush and a second washing step C using (i) a mixed solution of ammonia ($NH_4OH$) and a hydrogen peroxide solution ($H_2O_2$) or (ii) dilute hydrofluoric acid (HF). However, the polishing using the ceria based slurry has the following problem.

More specifically, at the polishing step A, the ceria based slurry clogs and remains in the concave portion 4MP (see a slurry residue 50P shown in FIG. 20). Such a slurry residue 50P is scraped out by means of the brush at the first washing step B, and is scattered and coagulates on the interlayer insulating film 4P (see the scattered slurry residue 50P shown in FIG. 21). The scattered slurry residue 50P is scarcely removed with the dilute hydrofluoric acid and cannot fully be removed with the $NH_4OH/H_2O_2$ mixed solution. For this reason, there has been a problem in that a desirable wiring shape cannot be obtained like a wiring 6P shown in a longitudinal sectional view of FIG. 21 when the wiring is formed on the interlayer insulating film 4P with the slurry residue 50P scattered. Such a disadvantage of the wiring shape causes the wiring to be short-circuited or disconnected, resulting in a reduction in the yield of the semiconductor device and a deterioration in reliability.

SUMMARY OF THE INVENTION

In order to solve the above-mentioned problems, it is an object of the present invention to provide a semiconductor device having high reliability without a disadvantage such as a wiring disconnection or the like which is caused by the remaining and scattering of a slurry to be used for a CMP method and a method of manufacturing the semiconductor device.

(1) A first aspect of the present invention is directed to a semiconductor device comprising a substrate having a main surface, an interlayer insulating film provided on the main surface of the substrate, at least two underlying layers provided in said interlayer insulating film which are stacked in a direction of a thickness of the interlayer insulating film and are not in contact with each other, and a hole for a mark formed in the interlayer insulating film from a surface of the interlayer insulating film which is opposite to the substrate to the underlying layer which is the closest to the surface of the interlayer insulating film.

(2) A second aspect of the present invention is directed to a semiconductor device comprising a substrate having a main surface, an interlayer insulating film provided on the main surface of the substrate, and a hole for a mark including a plurality of holes each of which is formed in the interlayer insulating film to have an opening entrance on a surface of the interlayer insulating film and each of which has a dimension of less than approximately 1 $\mu$m in a plane view of the main surface of the substrate.

(3) A third aspect of the present invention is directed to the semiconductor device according to the second aspect of the present invention, further comprising a metal layer provided in at least one of the holes.

(4) A fourth aspect of the present invention is directed to the semiconductor device according to the second or third aspect of the present invention, wherein the holes include at least one of a trench-shaped hole and a columnar hole.

(5) A fifth aspect of the present invention is directed to a semiconductor device comprising a substrate having a main surface, an interlayer insulating film provided on the main surface of the substrate, a hole for a mark formed in the interlayer insulating film to have an opening entrance formed on a surface of the interlayer insulating film which is opposite to the substrate, and a metal layer filled in the hole for a mark up to a vicinity of the opening entrance of the hole for a mark.

(6) A sixth aspect of the present invention is directed to a semiconductor device comprising a substrate having a main surface, an interlayer insulating film provided on the main surface of the substrate, a hole for a mark formed in the interlayer insulating film to have an opening entrance formed on a surface of the interlayer insulating film which is opposite to the substrate, and a metal layer provided in the hole for a mark and having a portion of a peak shape which is protruded to narrow the opening entrance.

(7) A seventh aspect of the present invention is directed to a semiconductor device comprising a substrate having a main surface, a first interlayer insulating film provided on the main surface of the substrate, a hole for a mark formed in the first interlayer insulating film to have an opening entrance formed on a surface of the first interlayer insulating film which is opposite to the substrate, a second interlayer insulating film provided to cover the hole for a mark and having a concave portion opened on a surface opposite to the substrate above the hole for a mark, and a dielectric layer provided in the concave portion of the second interlayer insulating film.

(8) An eighth aspect of the present invention is directed to the semiconductor device according to the seventh aspect of the present invention, wherein the concave portion of the second interlayer insulating film is filled with the dielectric layer up to the vicinity of the surface of the second interlayer insulating film.

(9) A ninth aspect of the present invention is directed to the semiconductor device according to the seventh aspect of the present invention, wherein the dielectric layer is provided on at least an inner surface of the concave portion of the second interlayer insulating film.

(10) A tenth aspect of the present invention is directed to the semiconductor device according to any one of the seventh to ninth aspects of the present invention, wherein the dielectric layer is formed of a material to which a slurry to be used for a CMP method sticks with more difficulty than the second interlayer insulating film.

(11) An eleventh aspect of the present invention is directed to the semiconductor device according to any one of the first to tenth aspects of the present invention, wherein the hole for a mark has a dimension of approximately 1 $\mu$m or more as seen from above the main surface of the substrate.

(12) A twelfth aspect of the present invention is directed to a method of manufacturing a semiconductor device comprising the steps of (a) forming a first interlayer insulating film on a main surface of a substrate to have a hole for a mark opened on a surface opposite to the substrate, (b) forming a second interlayer insulating film to cover the hole for a mark, (c) forming a dielectric layer on the second interlayer insulating film, and (d) polishing the second interlayer insulating film by a CMP method after the step (c).

(13) A thirteenth aspect of the present invention is directed to the method of manufacturing a semiconductor device according to the twelfth aspect of the present invention, further comprising the step of (e) removing the dielectric layer remaining after the step (d) is completed.

(14) A fourteenth aspect of the present invention is directed to the method of manufacturing a semiconductor device according to the twelfth or thirteenth aspect of the present invention, wherein the dielectric layer is formed of a material to which a slurry to be used for the CMP method sticks with more difficulty than the second interlayer insulating film.

(15) A fifteenth aspect of the present invention is directed to the method of manufacturing a semiconductor device according to any one of the twelfth to fourteenth aspects of the present invention, wherein the hole for a mark has a dimension of approximately 1 $\mu$m or more as seen from above the main surface of the substrate.

(1) According to the first aspect of the present invention, the hole for a mark can be made shallower as compared with the case in which the hole for a mark is provided from the surface of the interlayer insulating film to the main surface of the substrate. Therefore, also in the case in which a further interlayer insulating film is formed to cover the hole for a mark, it is possible to prevent the concave portion from being formed on the further interlayer insulating film above the hole for a mark. Accordingly, it is possible to prevent a slurry from remaining or being scattered by polishing the further interlayer insulating film using a CMP method. As a result, it is possible to provide a semiconductor device having high reliability without a disadvantage such as a wiring disconnection or the like which is caused by the remaining or scattered slurry.

(2) According to the second aspect of the present invention, the hole for a mark includes a plurality of holes having dimensions of less than approximately 1 $\mu$m, respectively. Consequently, also in the case in which the further interlayer insulating film is formed to cover the hole for a mark, it is possible to prevent a concave portion from being formed on the further interlayer insulating film above each hole. Accordingly, it is possible to prevent the slurry from remaining or being scattered by polishing the further interlayer insulating film using the CMP method. As a result, it is possible to provide a semiconductor device having high reliability without a disadvantage such as a wiring disconnection or the like which is caused by the remaining or scattered slurry.

(3) According to the third aspect of the present invention, the metal layer is provided in at least one of the holes. Therefore, the formation of the concave portion can be suppressed more reliably. Accordingly, the above-mentioned effect in (2) can be obtained more reliably. In particular, the whole surface side of the interlayer insulating film can be flattened by filling the hole with the metal layer up to the vicinity of the opening entrance thereof and/or providing the metal layer in all the holes. Thus, such an effect can be obtained more remarkably.

In this case, the holes have dimensions of less than approximately 1 $\mu$m, respectively. Therefore, the step of forming the metal layer in the holes and the step of filling, with the metal layer (so-called plug), other holes (for example, a contact hole and the like) which are formed in the interlayer insulating film and are smaller than the hole for a mark are carried out at the same time, it is possible to easily fill the holes with the metal layer up to the opening entrances thereof without unnecessarily wasting a time required for the formation.

Furthermore, in other words, the hole for a mark is divided into the holes. Therefore, it is possible to decrease materials forming the metal layer as compared with a large hole for a mark which is not divided. In addition, a time required for forming the metal layer can be shortened. Consequently, it is possible to provide a semiconductor device with a low cost.

(4) According to the fourth aspect of the present invention, in the case in which the holes include at least one of a trench-shaped hole and a columnar hole, the above-mentioned effect in (2) or (3) can be obtained.

(5) According to the fifth aspect of the present invention, the hole for a mark is filled with the metal layer up to the vicinity of the opening entrance thereof. Therefore, the whole surface side of the interlayer insulating film can be flattened. Consequently, also in the case in which a further interlayer insulating film is formed to cover the hole for a mark, it is possible to prevent a concave portion from being formed on the further interlayer insulating film above the hole for a mark. Accordingly, it is possible to prevent the slurry from remaining or being scattered by polishing the further interlayer insulating film using the CMP method. As a result, it is possible to provide a semiconductor device having high reliability without a disadvantage such as a wiring disconnection or the like which is caused by the remaining or scattered slurry.

(6) According to the sixth aspect of the present invention, the opening entrance of the hole for a mark is narrowed by the peak shape of the metal layer. Consequently, also in the case in which a further interlayer insulating film is formed to cover the hole for a mark, it is possible to prevent a concave portion from being formed on the further interlayer insulating film above the hole for a mark. Accordingly, it is possible to prevent the slurry from remaining or being scattered by polishing the further interlayer insulating film using the CMP method. As a result, it is possible to provide a semiconductor device having high reliability without a disadvantage such as a wiring disconnection or the like which is caused by the remaining or scattered slurry.

(7) According to the seventh aspect of the present invention, the dielectric layer is provided in the concave portion of the second interlayer insulating film. Therefore, the concave portion is narrowed corresponding to the dielectric layer as compared with the case in which the dielectric layer is not provided. Accordingly, it is possible to prevent a slurry from remaining or being scattered by polishing the second interlayer insulating film by the CMP method. As a result, it is possible to provide a semiconductor device having high reliability without a disadvantage such as a wiring disconnection or the like which is caused by the remaining or scattered slurry.

(8) According to the eighth aspect of the present invention, the concave portion of the second interlayer insulating film is filled with the dielectric layer up to the vicinity of the surface of the second interlayer insulating film. Accordingly, the above-mentioned effect in (7) can be obtained more reliably.

(9) According to the ninth aspect of the present invention, the dielectric layer is provided on at least the inner surface of the concave portion. Consequently, the concave portion, particularly, the opening entrance of the concave portion is narrowed corresponding to the dielectric layer. Accordingly, the same effect as in the above-mentioned (7) can be obtained.

(10) According to the tenth aspect of the present invention, the dielectric layer is formed of the material to which the slurry to be used for the CMP method sticks with more difficulty than the second interlayer insulating film. Consequently, it is possible to obtain any one of the effects of (7) to (9) more reliably.

(11) According to the eleventh aspect of the present invention, it is possible to obtain any one of the effects of (1) to (10) for the comparatively large hole for a mark which has a dimension of approximately 1 $\mu$m or more.

(12) According to the twelfth aspect of the present invention, the second interlayer insulating film is polished by the CMP method after the step (c). Consequently, even if the concave portion is provided on the surface of the second interlayer insulating film, it is possible to fill the concave portion with the dielectric layer and to carry out the above-mentioned polishing. Accordingly, it is possible to prevent a slurry from remaining or being scattered by polishing the second interlayer insulating film using the CMP method. As a result, it is possible to manufacture a semiconductor device having high reliability without a disadvantage such as a wiring disconnection or the like which is caused by the remaining or scattered slurry.

(13) According to the thirteenth aspect of the present invention, the dielectric layer remaining after the step (d) is removed at the step (e). Therefore, even if the slurry sticks to or remains on the dielectric layer, it is also possible to remove the slurry when removing the dielectric layer. Consequently, the effect of (12) can be obtained more reliably.

(14) According to the fourteenth aspect of the present invention, the dielectric layer is formed of the material to which the slurry to be used for the CMP method sticks with more difficulty than the second interlayer insulating film. Consequently, it is possible to obtain the effect of (12) or (13) more reliably.

(15) According to the fifteenth aspect of the present invention, it is possible to obtain any one of the effects of (12) to (14) for the comparatively large hole for a mark which has a dimension of approximately 1 $\mu$m or more.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a transverse sectional view typically illustrating the semiconductor device according to the sixth embodiment;

FIG. 13 is a transverse sectional view typically illustrating a second semiconductor device according to the sixth embodiment;

DESCRIPTION OF THE PREFERRED EMBODIMENTS

<A. First Embodiment>

Figure 1:
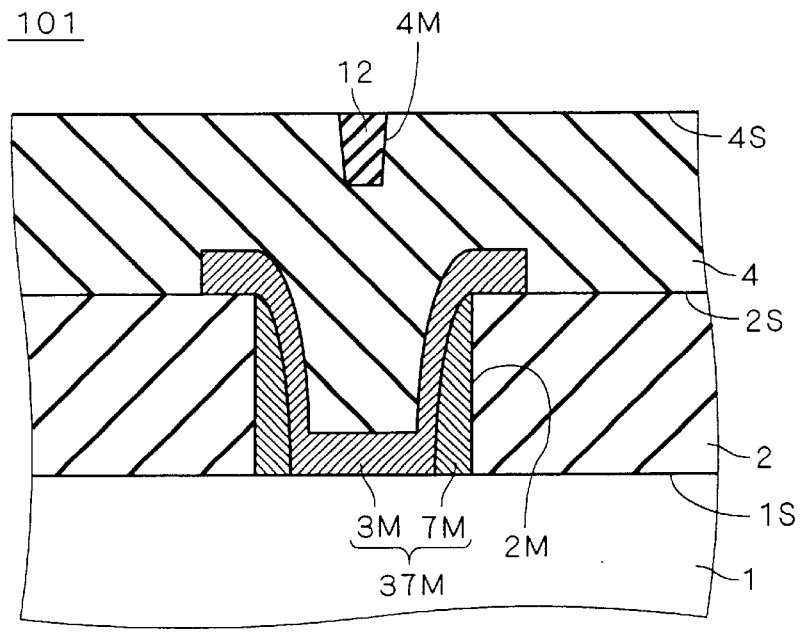
FIG. 1 is a longitudinal sectional view typically illustrating a semiconductor device according to a first embodiment.

FIG. 1 is a longitudinal sectional view typically illustrating a semiconductor device 101 according to a first embodiment. The semiconductor device 101 and a semiconductor device according to each embodiment which will be described below are characterized by a region corresponding to the region MP of the conventional semiconductor device 101P. Therefore, such a respect will be mainly described below.

As shown in FIG. 1, the semiconductor device 101 comprises a substrate 1 such as a silicon wafer. Various elements are formed in a region of the substrate 1 (not shown) corresponding to the region HP of the conventional semiconductor device 101P.

An interlayer insulating film (a first interlayer insulating film) 2 composed of a silicon oxide, for example, is formed on a main surface 1S of the substrate 1. A hole 2M for a mark is formed in a direction of a thickness of the interlayer insulating film 2. In detail, the hole 2M for a mark has a square opening entrance, for example, on a surface 2S of the interlayer insulating film 2 on the opposite side of the substrate 1, and is formed from the surface 2S to the main surface 1S of the substrate 1. It is assumed that the hole 2M for a mark has a dimension of approximately 1 $\mu$m or more in a plane view of the main surface 1S of the substrate 1. In the following description, a side wall surface of the interlayer insulating film 2 constituting a side wall surface of the hole 2M for a mark and a surface blocking the opening entrance of the hole 2M for a mark on the opposite side of the surface 2S of the interlayer insulating film 2, for example, the main surface 1S of the substrate 1 will be generally referred to as an inner surface of the hole 2M for a mark.

The "mark" includes various auxiliary patterns to be utilized in a process of manufacturing an alignment mark or the like, for example. Moreover, the "hole for a mark" includes a hole to be utilized for manufacture as the alignment mark or the like, and has a size which is almost equal to or more than the sizes of a contact hole and a via hole (see the contact hole 2HP and the via hole 4HP shown in FIG. 17). The contact hole and the via hole have sizes of approximately 0.3 to 0.4 µm, for example.

A metal layer 37M is formed on the inner surface of the hole 2M for a mark and on the surface 2S of the interlayer insulating film 2 in the vicinity of the opening entrance of the hole 2M for a mark. The metal layer 37M includes (i) a metal layer 7M provided in the form of a so-called side-wall spacer on the side wall surface of the interlayer insulating film 2 and (ii) a metal layer 3M to be a portion other than the metal layer 7M. The metal layer 7M has a single layer of tungsten (W) or three layers of titanium (Ti)/titanium nitride (TiN)/tungsten (W), for example. Moreover, the metal layer 3M has a single layer of aluminum (Al) or a three-layer structure having an aluminum (Al)-copper (Cu) alloy (hereinafter referred to as an Al—Cu alloy) sandwiched between titanium nitrides, for example.

An interlayer insulating film (a second interlayer insulating film) 4 composed of a silicon oxide, for example, is further formed to cover the hole 2M for a mark, more specifically, the metal layer 37M and the interlayer insulating film 2. The interlayer insulating film 4 has a thickness of approximately 700 to 1000 nm (7000 to 10000 angstrom), for example. The interlayer insulating film 4 has a concave portion 4M opened on the surface 4S side of the interlayer insulating film 4 which is opposite to the substrate 1 above the hole 2M for a mark.

In the semiconductor device 101, particularly, a dielectric layer 12 formed of a dielectric such as a silicon oxide is formed in the concave portion 4M. The dielectric layer 12 is provided up to the vicinity of the surface 4S of the interlayer insulating film 4. The surface 4S side of the interlayer insulating film 4 is wholly flattened by the dielectric layer 12.

Figure 17:
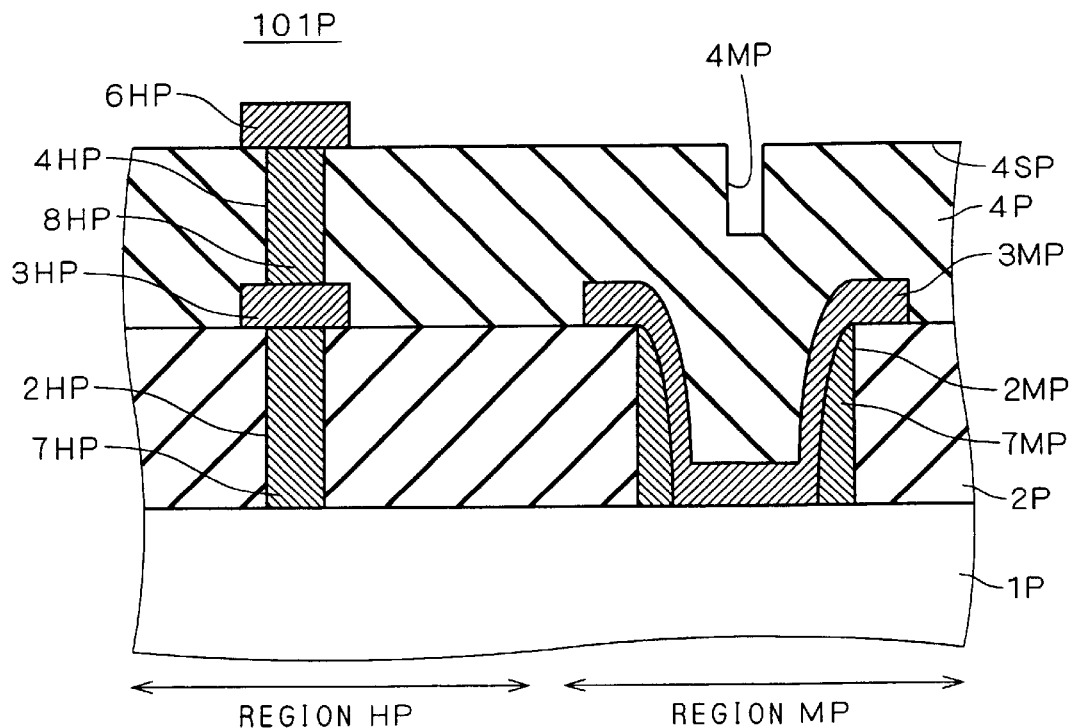
FIG. 17 is a longitudinal sectional view illustrating a conventional semiconductor device.
Figure 18:
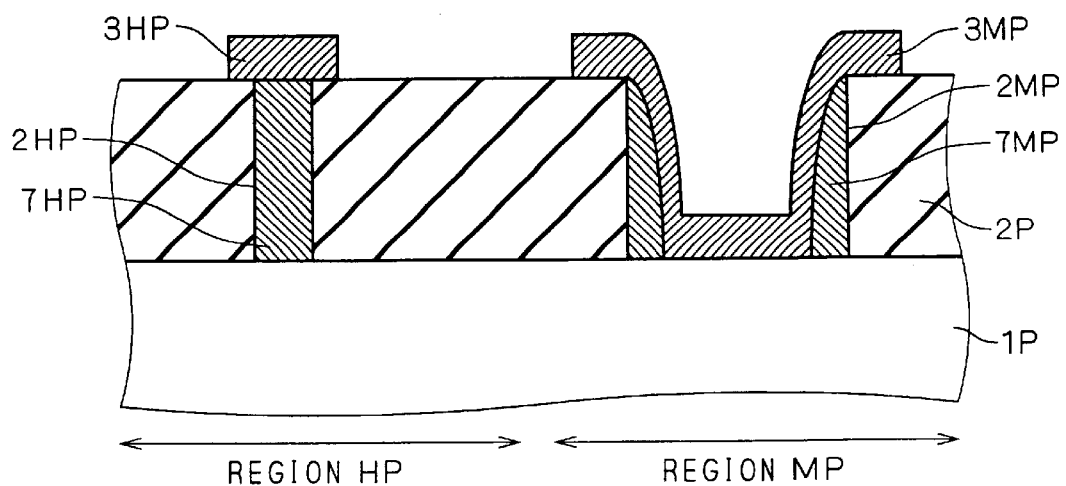
FIGS. 18 to 21 are longitudinal sectional views illustrating a method of manufacturing the conventional semiconductor device.

A contact hole is formed on the interlayer insulating film 2 and a via hole is formed on the interlayer insulating film 4 in the same manner as in the conventional semiconductor device 101P shown in FIG. 17, which are not shown in FIG. 1. A plug is provided in the contact hole and the via hole respectively, and a wiring is formed on the surfaces 2S and 4S of the interlayer insulating films 2 and 4 respectively. The plug is formed of the same material as the material of the metal layer 7M, and the wiring is formed of the same material as the material of the metal layer 3M.

Figure 2:
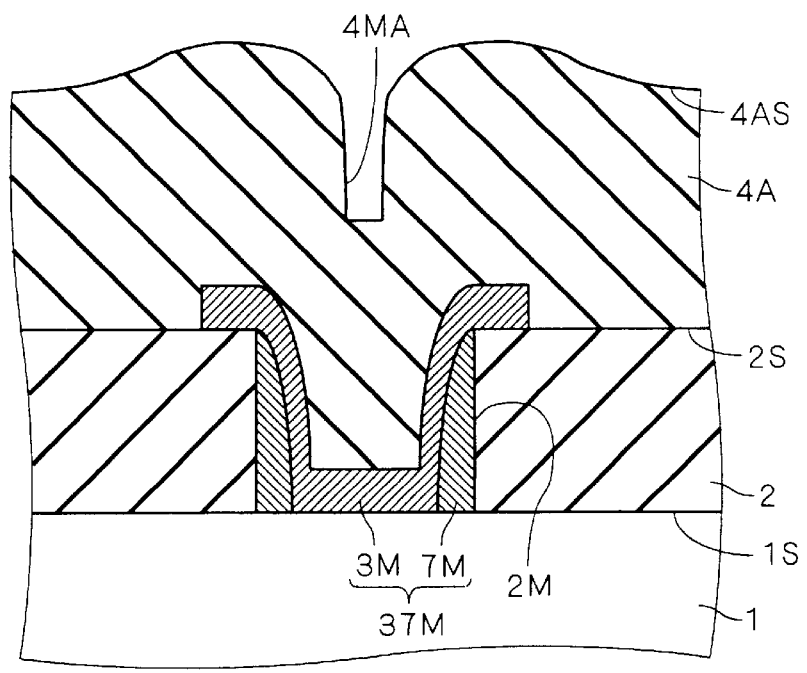
FIGS. 2 and 3 are longitudinal sectional views typically illustrating a method of manufacturing the semiconductor device according to the first embodiment.
Figure 3:
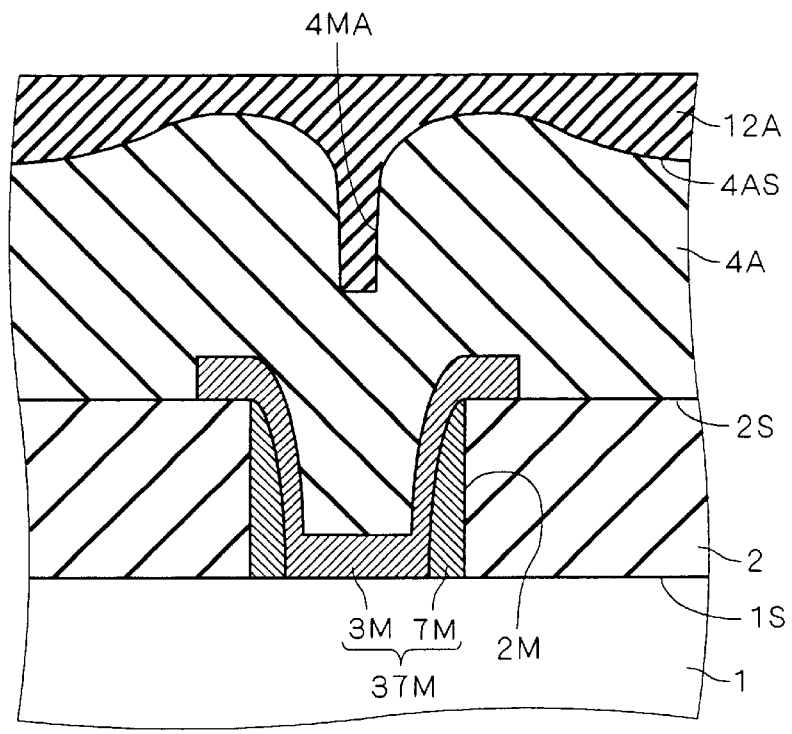

A method of manufacturing the semiconductor device 101 will be described below with reference to FIGS. 1 to 3. FIGS. 2 and 3 are longitudinal sectional views typically illustrating the method of manufacturing the semiconductor device 101.

First of all, a substrate 1 is prepared to deposit a silicon oxide (plasma oxide) by a plasma CVD method. The silicon oxide is flattened by using an etch-back method or a CMP method, thereby forming an interlayer insulating film 2.

Next, a surface 2S of the interlayer insulating film 2 is wholly coated with a resist. The resist is patterned to have such a pattern as to correspond to a hole 2M for a mark by a photolithographic technique. The interlayer insulating film 2 is opened by a RIE method using the patterned resist as a mask, thereby forming a hole 2M for a mark. Then, the resist is removed with an oxygen plasma or the like. The hole 2M for a mark and the contact hole can be formed at the same time.

Subsequently, tungsten is deposited by a CVD method to cover the whole interlayer insulating film 2, and is then etched back to form a metal layer 7M. Alternatively, titanium and a titanium nitride are sequentially deposited by a sputtering method, and tungsten is then deposited by the CVD method. Thereafter, the above-mentioned three layers are etched back to form the metal layer 7M. The metal layer 7M can be formed simultaneously with the formation of a plug in the contact hole.

Then, aluminum is deposited to wholly cover the interlayer insulating film 2 and the like. Alternatively, a titanium nitride, an Al—Cu alloy and the titanium nitride are sequentially deposited. At this time, these three layers can be flatly formed by using a high temperature sputtering method or a reflow sputtering method.

Next, the exposed surface of the deposited metal layer is wholly coated with a resist. The resist is patterned to have such a pattern as to correspond to a metal layer 3M by a photolithographic technique. Then, the metal layer is patterned to form the metal layer 3M by a RIE method using the patterned resist as a mask. Thereafter, the resist is removed with an oxygen plasma or the like. The metal layer 3M can be formed simultaneously with the formation of a wiring on the interlayer insulating film 2.

As shown in FIG. 2, subsequently, a silicon oxide film or an interlayer insulating film 4A having a thickness of approximately 1500 to 2500 nm (15000 to 25000 angstrom), for example, is formed by using a plasma CVD method to wholly cover the interlayer insulating film 2, the metal layer 37M and the like, that is, to cover the hole 2M for a mark. At this time, the whole interlayer insulating film 4A or a part of the substrate 1 side is formed by using a HDP (High Density Plasma)-CVD method. Consequently, the interlayer insulating film 4A can be formed without a void in a region of a wiring (not shown) provided with a fine pattern. The interlayer insulating film 4A is formed above the hole 2M for a mark to have a concave portion 4MA corresponding to the concave shape of the hole 2M for a mark.

In the present manufacturing method, particularly, a dielectric layer 12A composed of a silicon oxide, for example, is subsequently formed as shown in FIG. 3.

In detail, the exposed surface 4AS of the interlayer insulating film 4A or a surface 4AS on the opposite side of the substrate 1 is coated with chemicals obtained by dissolving a silicon oxide based material in a solvent by a rotary coating method (so-called SOG (Spin On Glass)), for example. By such a forming method, the chemicals can easily be buried in the concave portion 4MA. Next, the solvent in the applied chemicals is removed by baking at a temperature of approximately 150° C. to 300° C. Subsequently, the applied chemicals are changed into $SiO_2$ by the baking at a temperature of approximately 400° C. Consequently, a dielectric layer 12A is formed. By such a change into the $SiO_2$, the generation of a gas from the dielectric layer 12A can be lessened.

Then, the dielectric layer 12A and the interlayer insulating film 4A are polished and flattened by a CMP method using a slurry. In this case, the polishing is carried out such that the interlayer insulating film 4A provided on the wiring (not shown) has a predetermined thickness, for example, the thickness of approximately 700 to 1000 nm (7000 to 10000 angstrom) described above. By the flattening and polishing, the dielectric layer 12 and the interlayer insulating film 4 shown in FIG. 1 are obtained. A concave portion 4M shown in FIG. 1 is equivalent to a bottom part of the concave portion 4MA shown in FIG. 2.

In some cases, a silicon oxide film having a thickness of approximately 100 to 200 nm (1000 to 2000 angstrom), for example, is further formed by using the plasma CVD method after the polishing is carried out by the CMP method.

By the above-mentioned steps, the semiconductor device 101 is completed.

As described above, the concave portion 4MA is filled with the dielectric layer 12A and is polished by the CMP method. After the polishing, the concave portion 4M is filled with the dielectric layer 12 up to the vicinity of a surface 4S of the interlayer insulating film 4, and the whole surface 4S side of the interlayer insulating film 4 is flattened by the dielectric layer 12. Consequently, the slurry can be prevented from remaining in the concave portion 4M after the polishing. Thus, it is also possible to prevent the slurry from being scattered. As a result, it is possible to provide the semiconductor device 101 having high reliability without a disadvantage such as a wiring disconnection or the like which is caused by the remaining or scattered slurry.

Even if the dielectric layer 12 has a smaller height than the height of the surface 4S of the interlayer insulating film 4, the amount of the slurry remaining in the concave portion 4 can be more reduced than in the conventional semiconductor device 101P. Therefore, the above-mentioned effects can be obtained almost uniformly. Conversely, the concave portion 4M is filled with the dielectric layer 12 up to the vicinity of the surface 4S of the interlayer insulating film 4. Consequently, it is possible to obtain more reliable effects.

The dielectric layers 12 and 12A may be formed with an inorganic insulating material other than the above-mentioned silicon oxide.

<Second Embodiment>

Figure 4:
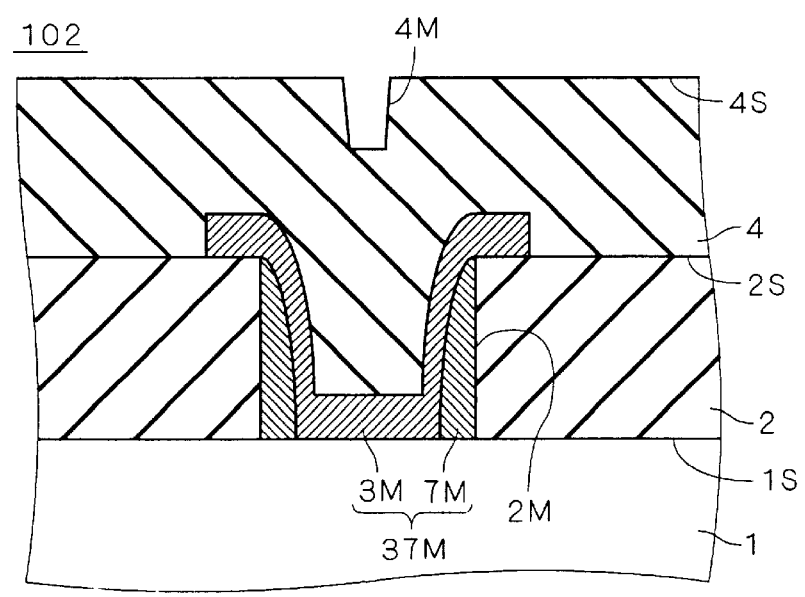
FIG. 4 is a longitudinal sectional view typically illustrating a semiconductor device according to a second embodiment.

FIG. 4 is a longitudinal sectional view typically illustrating a semiconductor device 102 according to a second embodiment. In the following description, the same components as those described above have the same reference numerals and their detailed explanation will be merely cited.

As is apparent from a comparison of FIG. 4 with FIG. 1 described above, the semiconductor device 102 basically has the same structure as the structure of the semiconductor device 101 and does not have the dielectric layer 12 (see FIG. 1) of the semiconductor device 101.

Figure 5:
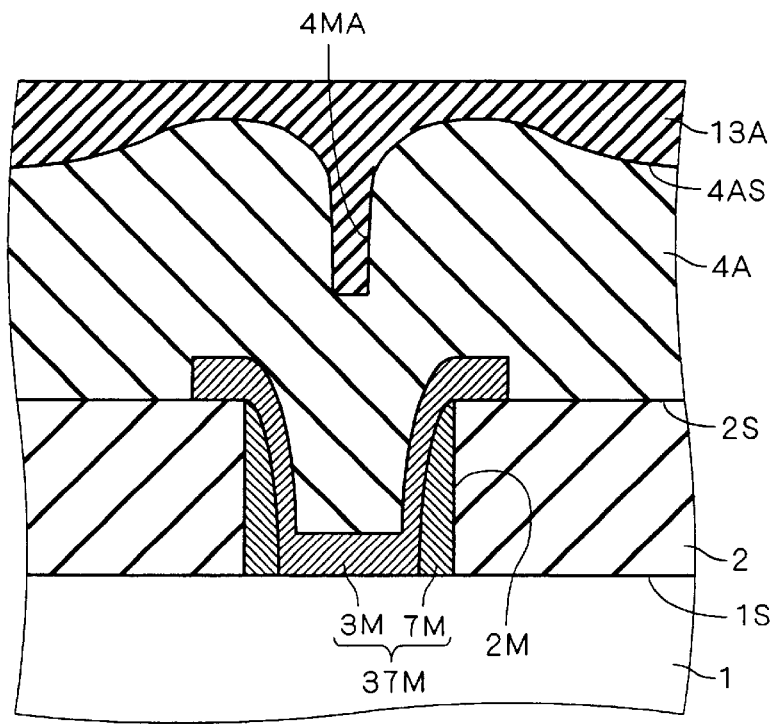
FIGS. 5 and 6 are longitudinal sectional views typically illustrating a method of manufacturing the semiconductor device according to the second embodiment.
Figure 6:
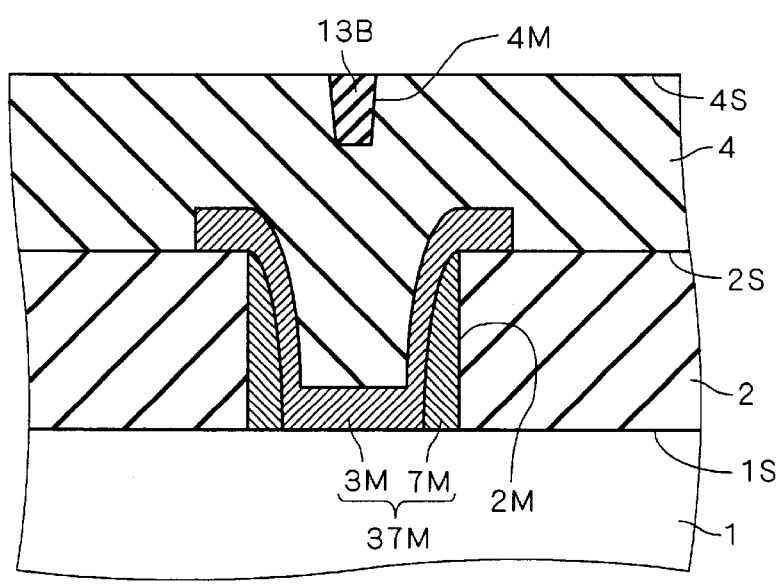

Next, a method of manufacturing the semiconductor device 102 will be described with reference to FIGS. 4 to 6 and FIG. 2 described above. FIGS. 5 and 6 are longitudinal sectional views typically illustrating the method of manufacturing the semiconductor device 102.

First of all, the semiconductor device in the state of FIG. 2 is prepared by the manufacturing method according to the first embodiment.

In the manufacturing method according to the second embodiment, subsequently, a dielectric layer 13A composed of a silicon oxide is formed, for example, as shown in FIG. 5. In detail, a surface 4AS of an interlayer insulating film 4A is coated with chemicals obtained by dissolving a silicon oxide based material in a solvent by a rotary coating method (so-called SOG), for example. Next, the solvent in the applied chemicals is removed by baking at a temperature of approximately 150° C. to 300° C., thereby forming a dielectric layer 13A.

Then, the dielectric layer 13A and the interlayer insulating film 4A are polished and flattened by a CMP method using a slurry. By such flattening and polishing, a dielectric layer 13B and an interlayer insulating film 4 shown in FIG. 6 are obtained.

In the manufacturing method according to the second embodiment, particularly, the dielectric layer 13B is then removed by using hydrofluoric acid, for example. Since the dielectric layer 13B (or 13A) is not subjected to the baking at a temperature of approximately 400° C. differently from the manufacturing method according to the first embodiment, it is not completely changed into $SiO_2$. In general, there has been known the fact that a silicon oxide film formed by the SOG method has a lower density than the density of a silicon oxide film formed by a CVD method or the like and the former has an etching rate for the hydrofluoric acid much greater than the etching rate of the latter. In other words, the etching rate of the dielectric layer 13B is greater than that of the interlayer insulating film 4. By a difference between the etching rates, the dielectric layer 13B can be removed while controlling the etching amount of the interlayer insulating film 4. By the above-mentioned steps, the semiconductor device 102 is completed.

As described above, a concave portion 4MA is filled with the dielectric layer 13A and is then polished by a CMP method. For this reason, the slurry can be prevented from remaining in the polished concave portion 4M in the same manner as in the first embodiment. Consequently, it is also possible to prevent the slurry from being scattered.

In this case, even if the dielectric layer 13A is excessively polished during the polishing performed by the CMP method and the slurry remains in the concave portion 4M, the remaining slurry can also be removed during the removal of the dielectric layer 13B. Consequently, the above-mentioned remaining and scattering of the slurry can be prevented more reliably.

As a result, it is possible to provide the semiconductor device 102 having high reliability without a disadvantage such as a wiring disconnection or the like which is caused by the remaining or scattered slurry.

The dielectric layers 13A and 13B may be formed of a resist. In such a case, the resist is removed by an organic solvent, an oxygen plasma or the like, for example, after the polishing.

Moreover, the dielectric layers 13A and 13B may be formed of other inorganic and organic insulating materials.

<Third Embodiment>

Figure 7:
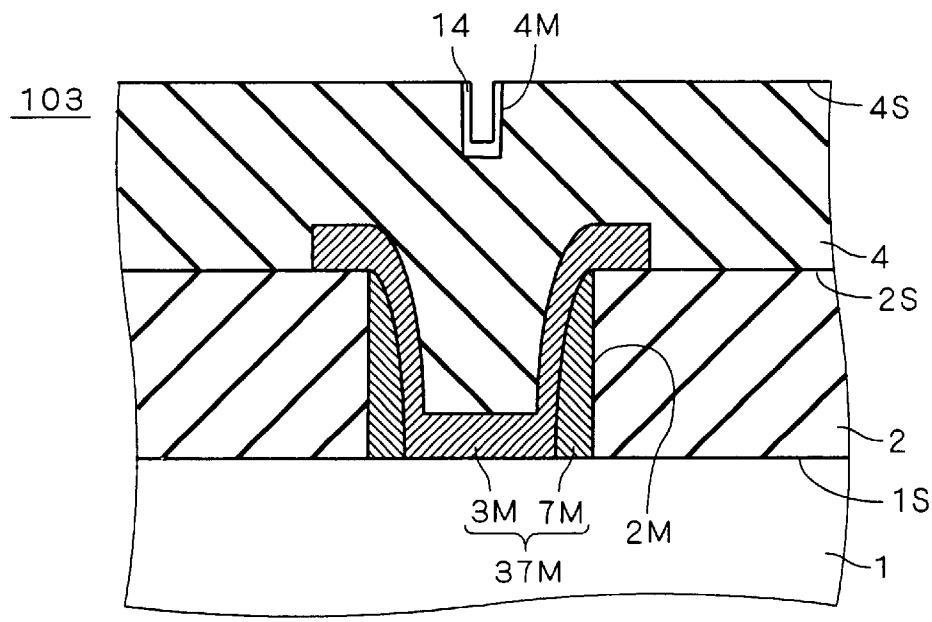
FIG. 7 is a longitudinal sectional view typically illustrating a semiconductor device according to a third embodiment.

FIG. 7 is a longitudinal sectional view typically illustrating a semiconductor device 103 according to a third embodiment.

As is apparent from a comparison of FIG. 7 with FIG. 1 described above, the semiconductor device 103 basically has the same structure as the structure of the semiconductor device 101, and furthermore, comprises a dielectric layer 14 in place of the dielectric layer 12 (see FIG. 1) of the semiconductor device 101. In detail, the dielectric layer 14 is comparatively thinly formed, for example, in a thickness of approximately 30 to 100 nm (300 to 1000 angstrom) on an inner surface of a concave portion 4M. Moreover, the concave portion 4M is not completely filled with the dielectric layer 14. Description will be given to the case in which the dielectric layer 14 is formed of a low density silicon oxide.

Figure 8:
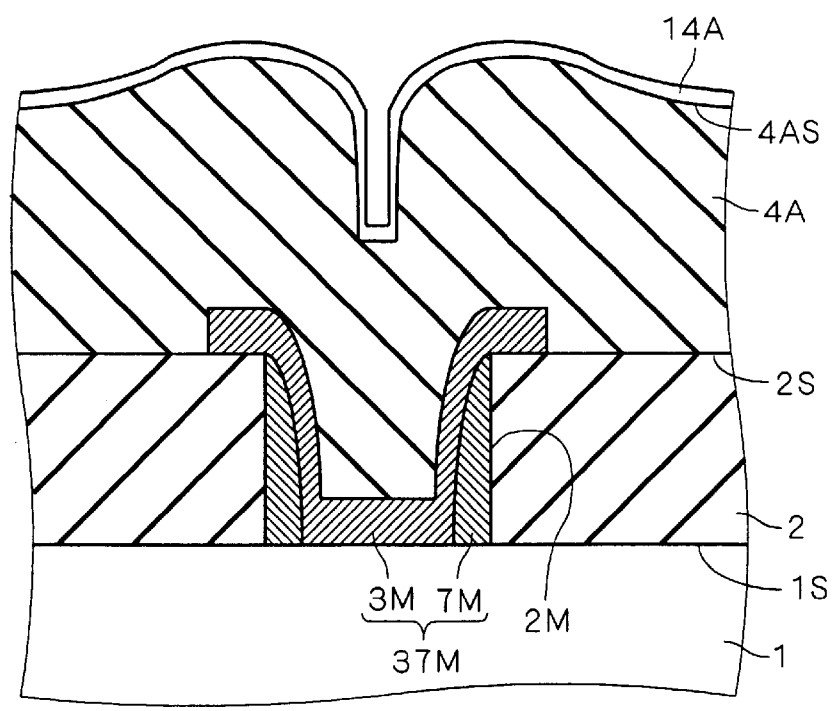
FIG. 8 is a longitudinal sectional view typically illustrating a method of manufacturing the semiconductor device according to the third embodiment.

Next, a method of manufacturing the semiconductor device 103 will be described with reference to FIGS. 7 and 8 and FIG. 2 described above. FIG. 8 is a longitudinal sectional view typically illustrating the method of manufacturing the semiconductor device 103.

First of all, the semiconductor device in the state of FIG. 2 is prepared by the manufacturing method according to the first embodiment or the like.

In the manufacturing method according to the third embodiment, subsequently, a dielectric layer 14A composed of a low density silicon oxide is formed over a whole surface 4AS of an interlayer insulating film 4A as shown in FIG. 8. Such a low density silicon oxide can be formed by setting RF power in a plasma CVD method lower than that during the formation of the interlayer insulating film 4A or the like, for example.

Then, the dielectric layer 14A and the interlayer insulating film 4A are polished and flattened by a CMP method using a slurry. By such flattening and polishing, the dielectric layer 14 and the interlayer insulating film 4 shown in FIG. 7 are obtained. By the above-mentioned steps, the semiconductor device 103 is completed.

In the semiconductor device 103, thus, in the case in which the dielectric layer 14 is not provided, that is, as compared with the conventional semiconductor device 101P, the concave portion 4M is narrowed corresponding to the dielectric layer 14. In particular, an opening entrance of the concave portion 4M is narrowed. Consequently, the residual amount of the slurry can be correspondingly reduced after the polishing.

In the CMP method using a ceria based slurry, polishing proceeds in such a mechanism that the slurry forms a quality changed layer on a surface of an object to be polished and the quality changed layer is polished and removed. In this case, a polishing rate is determined by easiness of the formation of the quality changed layer. The easiness of the formation of the quality changed layer is varied depending on the object to be polished. For example, a low density silicon oxide forming the dielectric layer 14A forms a quality changed layer with more difficulty than a silicon oxide forming the interlayer insulating film 4A. In other words, the dielectric layer 14A has a lower wettability or a low degree of adhesion to the ceria based slurry than the interlayer insulating film 4A. In other words, the ceria based slurry coagulates or sticks to the dielectric layer 14A with difficulty.

Consequently, even if the slurry remains in the concave portion 4M after the polishing, the remaining slurry can be removed easily and reliably at the above-mentioned washing steps B and C to be performed after the polishing. Accordingly, in the case in which the dielectric layer 14A is not provided, that is, as compared with the conventional semiconductor device 101P, it is possible to prevent the remaining and scattering of the slurry after the polishing.

Thus, it is possible to provide the semiconductor device 103 having high reliability without a disadvantage such as a wiring disconnection or the like which is caused by the remaining or scattered slurry.

Even if the dielectric layers 14A and 14 are formed of other materials to which a ceria based slurry sticks with more difficulty than the interlayer insulating films 4A and 4, for example, a silicon nitride or the like in place of the low density silicon oxide, the same effects can be obtained.

Moreover, the above-mentioned dielectric layers 12A and 12 and dielectric layers 13A and 13B may be formed of such a material as to form the dielectric layers 14A and 14. In these cases, the effect of preventing the slurry from remaining or being scattered can be obtained more reliably.

<Fourth Embodiment>

Figure 9:
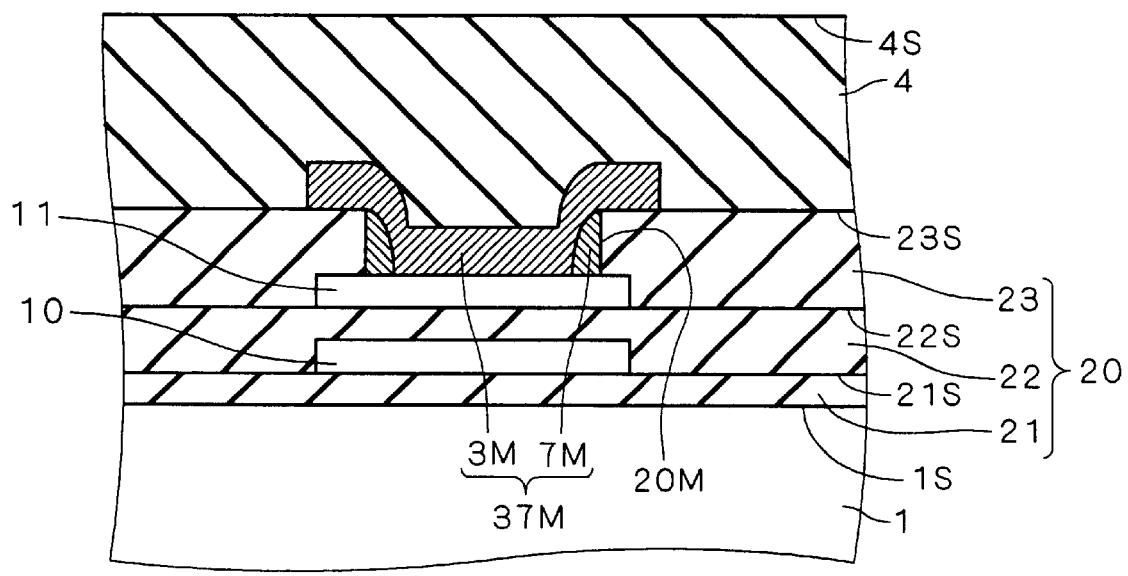
FIG. 9 is a longitudinal sectional view typically illustrating a semiconductor device according to a fourth embodiment.

FIG. 9 is a longitudinal sectional view typically illustrating a semiconductor device 104 according to a fourth embodiment. As shown in FIG. 9, an interlayer insulating film 20 composed of a silicon oxide, for example, is formed on a main surface 1S of a substrate 1. In the interlayer insulating film 20, two polysilicon layers (underlying layers) 10 and 11 are stacked in a direction of a thickness of the interlayer insulating film 20. Both polysilicon layers 10 and 11 are not provided in contact with each other.

In detail, an interlayer insulating film 21 is formed as a lower layer on the main surface 1S of the substrate 1, and a polysilicon layer 10 is formed in a predetermined region on a surface 21S of the interlayer insulating film 21 which is opposite to the substrate 1. An interlayer insulating film 22 is formed as a middle layer to cover the polysilicon layer 10 and the interlayer insulating film 21, and a polysilicon layer 11 is formed in a predetermined region on a surface 22S of the interlayer insulating film 22 which is opposite to the substrate 1. An interlayer insulating film 23 is formed as an upper layer to cover the interlayer insulating film 22. The three interlayer insulating films 21 to 23 constitute the interlayer insulating film 20.

A hole 20M for a mark equivalent to the above-mentioned hole 2M for a mark (see FIG. 1) is formed on the interlayer insulating film 23 provided as the upper layer. In detail, the hole 20M for a mark has an opening entrance on a surface 23S of the interlayer insulating film 23 which is opposite to the substrate 1 or a surface 23S of the interlayer insulating film 20 and reaches the polysilicon layer 11 which is the closest to the surface 23S.

A metal layer 37M is formed on an inner surface of the hole 20M for a mark including a side wall surface of the interlayer insulating film 23 and a surface of the polysilicon layer 11 on the opposite side of the substrate 1 and on the surface 23S of the interlayer insulating film 23 in the vicinity of an opening entrance of a hole 23M for a mark. Furthermore, an interlayer insulating film 4 is formed to cover the metal layer 37M and the interlayer insulating film 20.

Next, a method of manufacturing the semiconductor device 104 will be described. First of all, a substrate 1 is prepared to form an interlayer insulating film 21 as a lower layer on a main surface 1S of the substrate 1. Then, polysilicon is wholly deposited over a surface 21S of the interlayer insulating film 21 and is patterned to form a polysilicon layer 10. The polysilicon layer 10 may be formed by a lift-off method or the like. In the same manner as the interlayer insulating film 21 and the polysilicon layer 10 described above, an interlayer insulating film 22 to be a middle layer and a polysilicon layer 11 are formed.

Subsequently, an interlayer insulating film 23 is formed as an upper layer in the same manner as the interlayer insulating films 21 and 22. The interlayer insulating film 23 is patterned to form a hole 20M for a mark. Also in the case in which the hole 20M for a mark and a contact hole are formed at the same time, the polysilicon layer 11 acts as an etching stopper. Therefore, it is possible to prevent the hole 20M for a mark from being formed excessively deeply. At the time of formation, each of the interlayer insulating films 21 to 23 is flattened by a CMP method or the like if necessary.

Then, a metal layer 37M and an interlayer insulating film 4A (see FIG. 2) are formed in the same manner as in the manufacturing method according to the first embodiment or the like. Then, the interlayer insulating film 4A is flattened and polished by the CMP method. Thus, an interlayer insulating film 4 is formed. By the above-mentioned steps, the semiconductor device 104 shown in FIG. 9 is completed.

Figure 19:
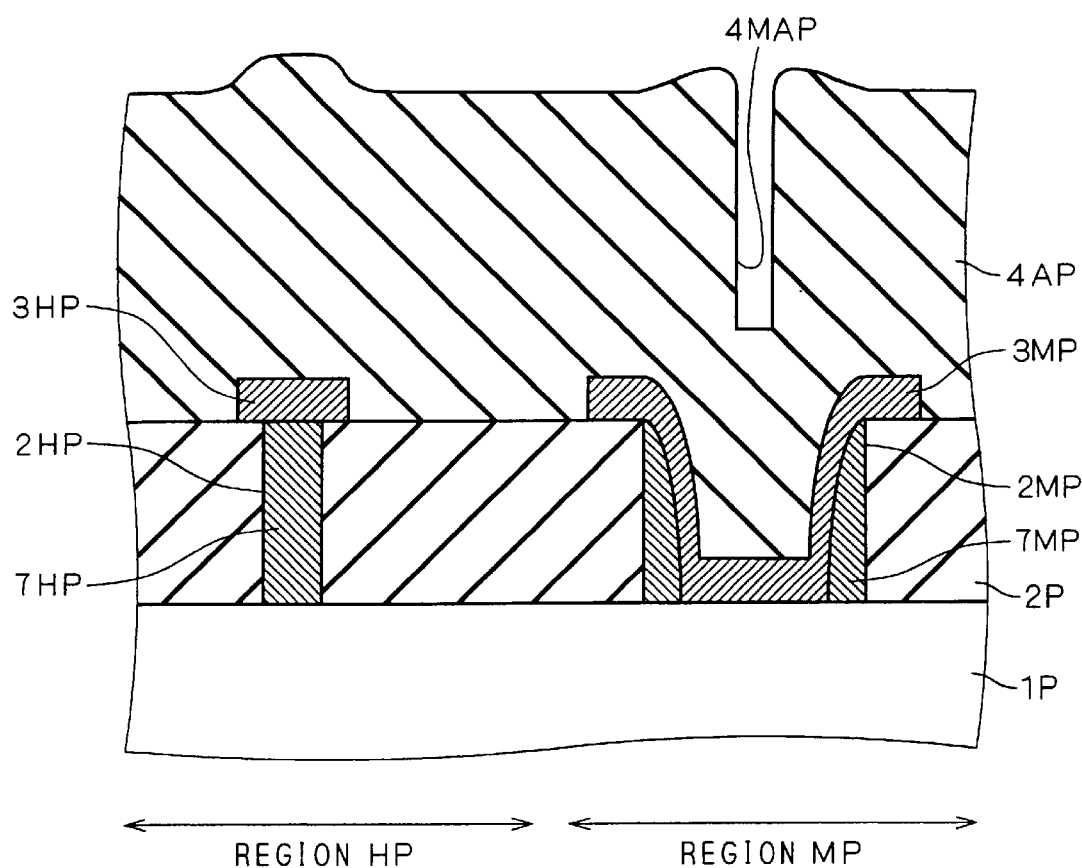
Figure 20:
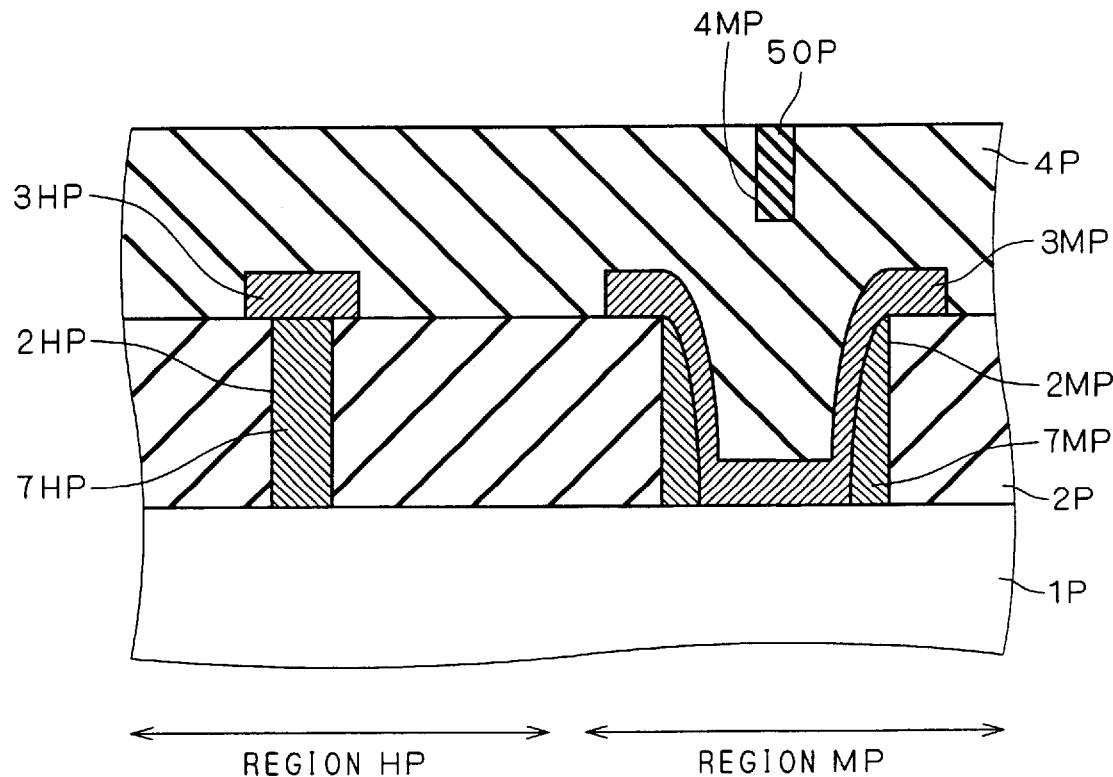
Figure 21:
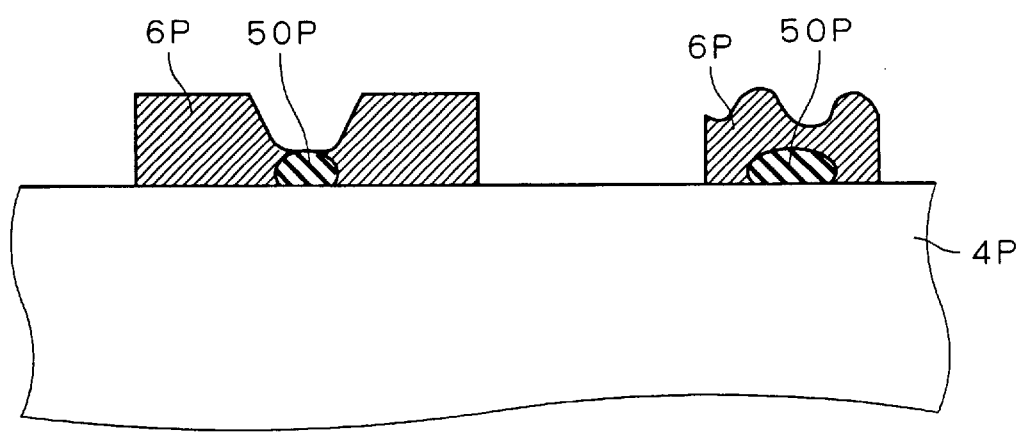

As described above, the hole 20M for a mark of the semiconductor device 104 is formed in such a region as to reach the polysilicon layer 11 which is the closest to a surface 23S of the interlayer insulating film 20 from the surface 23S. Consequently, the hole 20M for a mark is shallower than the contact hole reaching the substrate 1 from the surface 23S and a hole for a mark having the same depth as the contact hole. Accordingly, it is possible to prevent a concave portion (see the concave portion 4MAP in FIG. 19) from being formed on the interlayer insulating film 4A. Therefore, the remaining and scattering of a slurry caused in the conventional semiconductor device 101P can be prevented. As a result, it is possible to provide the semiconductor device 104 having high reliability without a disadvantage such as a wiring disconnection or the like which is caused by the remaining or scattered slurry.

While the description has been given to the case in which the two polysilicon layers 10 and 11 are provided in the interlayer insulating film 20, three or more polysilicon layers may be provided. In this case, the greater number of polysilicon layers are more effective. The reason is as follows. For example, in the case in which a BPSG (Boro Phospho Silicate Glass) film is subjected to reflow to form an interlayer insulating film, the interlayer insulating film provided on the polysilicon layer can be made thinner with an increase in the number of the polysilicon layers. In other words, the hole for a mark can be made shallower.

In place of the polysilicon layers 10 and 11, moreover, an underlying layer may be formed of other materials such as an aluminum alloy, a refractory metal and the like. Also in these cases, the above-mentioned effects can be obtained.

<Fifth Embodiment>

Figure 10:
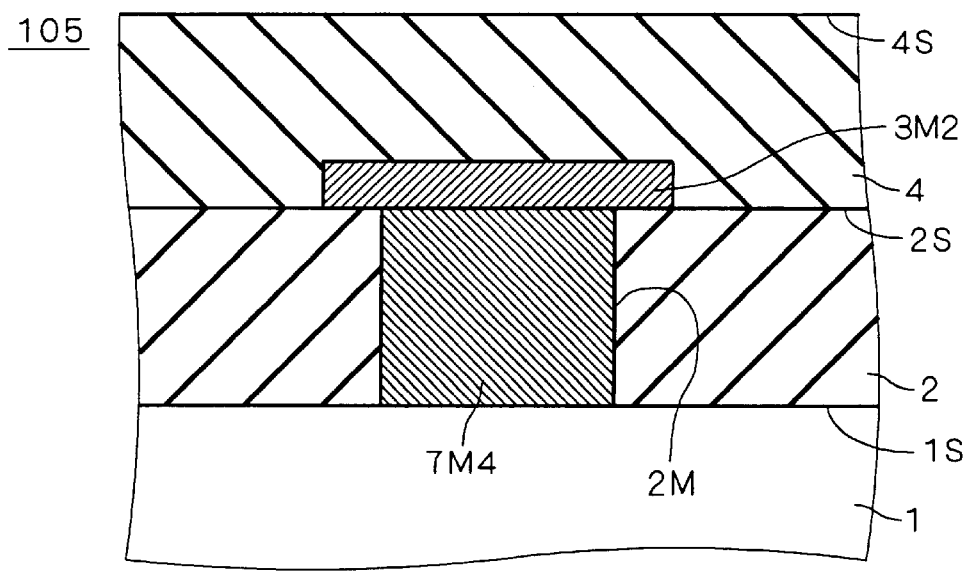
FIG. 10 is a longitudinal sectional view typically illustrating a semiconductor device according to a fifth embodiment.

FIG. 10 is a longitudinal sectional view typically illustrating a semiconductor device 105 according to a fifth embodiment. As shown in FIG. 10, the semiconductor device 105 has a structure in which a hole 2M for a mark is filled with a metal layer 7M4 composed of the same material as the material of the metal layer 7M (see FIG. 1) up to the vicinity of a surface 2S of an interlayer insulating film 2. Moreover, a metal layer 3M2 formed of the same material as the material of the above-mentioned metal layer 3M (see FIG. 1) is formed on the surface 2S of the interlayer insulating film 2 to cover the hole 2M for a mark.

The metal layer 7M4 is formed by depositing tungsten having such a sufficient thickness as to fill in the hole 2M for a mark using a CVD method, for example, and by etching back the deposited tungsten. The tungsten layer deposited by the CVD method may be polished by a CMP method to form the metal layer 7M4. Moreover, the metal layer 7M4 may be formed by using a so-called tungsten (W) selective growth method.

Subsequently, a predetermined metal material is deposited and patterned to form a metal layer 3M2 in the same manner as in the method of forming the metal layer 3M described above. The metal layer 3M2 can be formed simultaneously with the formation of a wiring on the interlayer insulating film 2.

Then, an interlayer insulating film 4A (see FIG. 2) is formed in the same manner as in the above-mentioned forming method, and is flattened and polished by the CMP method. Consequently, an interlayer insulating film 4 is obtained. Thus, the semiconductor device 105 is completed.

As described above, the hole 2M for a mark is filled with the metal layer 7M4 up to the vicinity of an opening entrance of the hole 2M for a mark. Therefore, the whole surface 2S side of the interlayer insulating film 2 is flattened. As compared with the case in which the hole 2M for a mark is not filled with the metal layer 7M4 up to the vicinity of the opening entrance thereof, consequently, it is possible to prevent a concave portion (see the concave portion 4MAP in FIG. 19) from being formed on the interlayer insulating film 4A. Therefore, the remaining and scattering of a slurry can be suppressed. As a result, it is possible to provide a semiconductor device 105 having high reliability without a disadvantage such as a wiring disconnection or the like which is caused by the remaining or scattered slurry.

<Sixth Embodiment>

Figure 11:
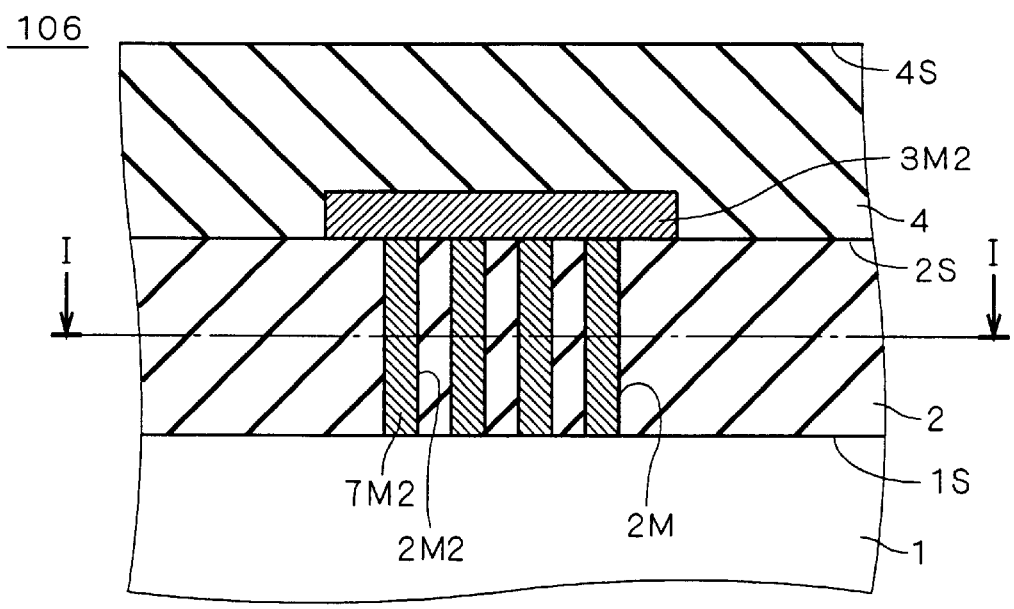
FIG. 11 is a longitudinal sectional view typically illustrating a semiconductor device according to a sixth embodiment.

FIGS. 11 and 12 are a longitudinal sectional view and a transverse sectional view which typically illustrate a semiconductor device 106 according to a sixth embodiment, respectively. FIG. 12 is a transverse sectional view taken along the line I—I in FIG. 11, and FIG. 11 is a longitudinal sectional view taken along the line II—II in FIG. 12.

As shown in FIGS. 11 and 12, the semiconductor device 106 has such a structure that the hole 2M for a mark comprises a plurality of (four) trench-shaped holes 2M2 for a mark each of which has an opening entrance on a surface 2S of an interlayer insulating film 2 and is formed in the interlayer insulating film 2. In other words, the hole 2M for a mark is divided into a plurality of holes 2M2 for a mark.

Each hole 2M2 for a mark is filled with a metal layer 7M2 formed of the same material as the material of the metal layer 7M (see FIG. 1) up to the vicinity of the surface 2S of the interlayer insulating film 2. Moreover, the metal layer 3M2 is formed to cover the hole 2M for a mark.

Next, a method of manufacturing the semiconductor device 106 will be described. First of all, an interlayer insulating film 2 is formed in the same manner as in the above-mentioned forming method. In place of the above-mentioned hole 2M for a mark, a plurality of holes 2M2 for a mark are patterned on the interlayer insulating film 2.

Then, a predetermined metal material is deposited and etched back to form a metal layer 7M2 in the same manner as in the method of forming the metal layer 7M. At this time, each hole 2M2 for a mark is smaller than the hole 2M for a mark. Therefore, each hole 2M2 for a mark is filled with the metal layer 7M2 differently from the metal layer 7M having the shape of a side-wall spacer in FIG. 1. The metal layer 7M2 can be formed simultaneously with the formation of a plug in a contact hole.

Subsequently, a predetermined metal material is deposited and patterned to form a metal layer 3M2 in the same manner as in the above-mentioned method of forming the metal layer 3M. The metal layer 3M2 can be formed simultaneously with the formation of a wiring on the interlayer insulating film 2.

Thereafter, an interlayer insulating film 4A (see FIG. 2) is formed in the same manner as in the above-mentioned forming method, and is flattened and polished by a CMP method. Consequently, an interlayer insulating film 4 is obtained. Thus, the semiconductor device 106 is completed.

As described above, in the semiconductor device 106, the hole 2M for a mark is divided into a plurality of holes 2M2 for a mark. In addition, each hole 2M2 for a mark is filled with the metal layer 7M2 up to the vicinity of the surface 2S of the interlayer insulating film 2. The whole surface 2S side of the interlayer insulating film 2, and furthermore, the whole surface 4S side of the interlayer insulating film 4 are flattened. Accordingly, it is possible to prevent a concave portion (see the concave portion 4MAP in FIG. 19) from being formed on the interlayer insulating film 4A. Consequently, the remaining and scattering of a slurry can be suppressed. As a result, it is possible to provide the semiconductor device 106 having high reliability without a disadvantage such as a wiring disconnection or the like which is caused by the remaining or scattered slurry.

In particular, the above-mentioned effects can remarkably be obtained by setting the hole 2M2 for a mark to have a dimension of less than approximately 1 μm in a plane view of a main surface 1S of a substrate 1. In the case of such dimension setting, even if the step of forming the metal layer 7M2 in the hole 2M2 for a mark and the step of filling a contact hole (which is almost equal to or smaller than the hole 2M for a mark) with a plug are carried out at the same time, the hole 2M2 for a mark can easily be filled with the metal layer 7M2 up to the vicinity of an opening entrance thereof without unnecessarily wasting a time required for formation.

By setting the dimension of the hole 2M2 for a mark equal to or greater than that of the contact hole, a technique for forming the contact hole can be applied to form the hole 2M2 for a mark. More specifically, the hole 2M2 for a mark and the contact hole can be formed at the same time without using a separate process of forming the hole 2M2 for a mark.

Furthermore, the hole 2M for a mark is divided into a plurality of holes 2M2 for a mark. Therefore, it is possible to decrease the materials forming the metal layer 7M2 as compared with the semiconductor device 105 shown in FIG. 10, and a time required for forming the metal layer 7M2 can be shortened. Consequently, the cost of the semiconductor device can be reduced.

In the case in which the hole 2M2 for a mark itself is comparatively small, the whole surface 2S and 4S sides of the interlayer insulating films 2 and 4 can be flattened almost uniformly even if each hole 2M2 for a mark is not filled with the metal layer 7M2. To the contrary, the metal layer 7M2 is provided in at least one of the holes 2M2 for a mark. Consequently, the flattening, that is, the effect of suppressing the concave portion can be obtained more reliably. By filling the hole 2M2 for a mark with the metal layer 7M2 up to the vicinity of the opening entrance thereof and/or providing the metal layer 7M2 on all the holes 2M2 for a mark, particularly, the effect of suppressing the concave portion can be obtained more remarkably.

The same effects can be obtained by the following semiconductor device according to a variant of the semiconductor device 106.

First of all, a trench-shaped hole 2M2 for a mark may be formed in a direction orthogonal to that in FIG. 12 as in a semiconductor device 106B shown in a transverse sectional view of FIG. 13.

Figure 14:
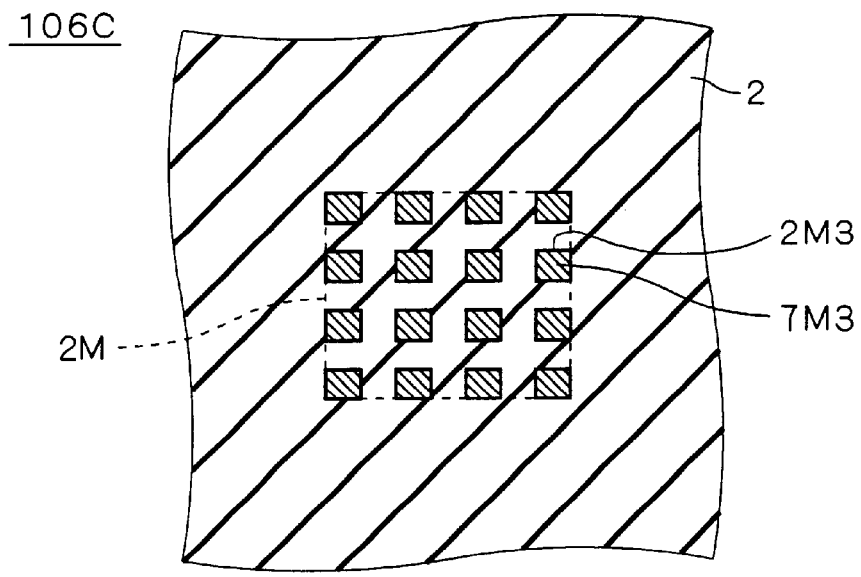
FIG. 14 is a transverse sectional view typically illustrating a third semiconductor device according to the sixth embodiment.

As in a semiconductor device 106C shown in a transverse sectional view of FIG. 14, moreover, the hole 2M for a mark may be constituted by a plurality of (4×4) columnar holes 2M3 for a mark each of which has an opening entrance on a surface 2S of an interlayer insulating film 2 and are provided in a matrix. The same metal layer 7M3 as the metal layer 7M2 is provided in each hole 2M3 for a mark.

At this time, the hole 2M3 for a mark is set to have a dimension of less than approximately 1 μm in a plane view of a main surface 1S of a substrate 1. Consequently, it is possible to obtain the above-mentioned effects of the hole 2M2 for a mark by thus setting the dimension.

Figure 15:
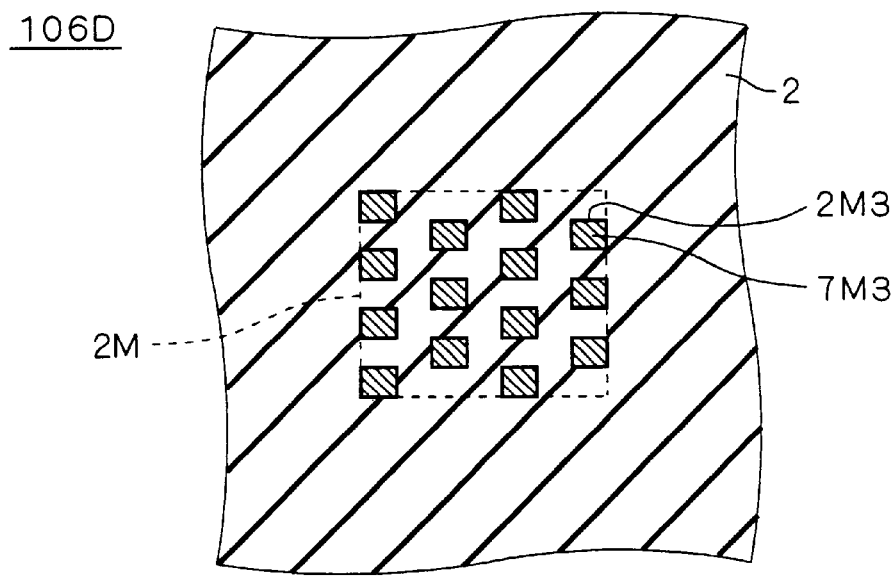
FIG. 15 is a transverse sectional view typically illustrating a fourth semiconductor device according to the sixth embodiment.

Moreover, each hole 2M3 for a mark may have a different array from an array in the semiconductor device 106C in FIG. 14 as in a semiconductor device 106D shown in a transverse sectional view of FIG. 15. More specifically, the holes 2M3 for a mark may be arranged in such a manner that they are not provided adjacently to each other in a row direction (a transverse direction on the paper) between adjacent columns (a longitudinal direction on the paper).

Furthermore, the trench-shaped hole 2M2 for a mark and the columnar hole 2M3 for a mark may be combined.

<Seventh Embodiment>

Figure 16:
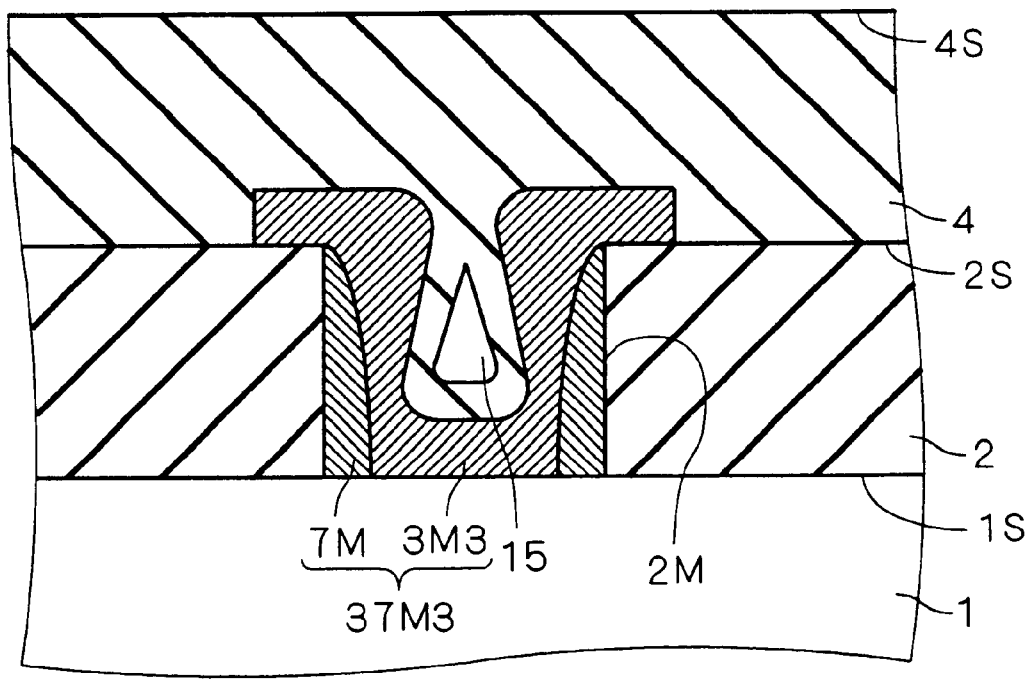
FIG. 16 is a longitudinal sectional view typically illustrating a semiconductor device according to a seventh embodiment.

FIG. 16 is a longitudinal sectional view typically illustrating a semiconductor device 107 according to a seventh embodiment.

As shown in FIG. 16, the semiconductor device 107 comprises a metal layer 37M3 in place of the metal layer 37M (see FIG. 1). In detail, the metal layer 37M3 basically has the same shape as the shape of the metal layer 37M and a portion provided in the vicinity of an opening entrance of a hole 2M for a mark has a protruded peak shape to narrow the opening entrance. The metal layer 37M3 includes the metal layer 7M and a metal layer 3M3 provided in a portion other than the metal layer 7M, and the metal layer 3M3 has the above-mentioned peak shape.

The metal layer 3M3 (or 37M3) having such a shape can be formed by a high temperature sputtering method, a reflow sputtering method or the like, for example. In some cases, a void 15 is formed on an interlayer insulating film 4 due to the peak shape of the metal layer 37M3.

According to the semiconductor device 107, the opening entrance of the hole 2M for a mark is narrowed by the peak shape of the metal layer 37M3. Consequently, it is possible to prevent a concave portion (see the concave portion 4MAP in FIG. 19) from being formed on the interlayer insulating film 4A as compared with the case in which the metal layer 37M does not have the peak shape. Thus, the remaining and scattering of a slurry can be suppressed. As a result, it is possible to provide the semiconductor device 107 having high reliability without a disadvantage such as a wiring disconnection or the like which is caused by the remaining or scattered slurry.

<Addition>

If the holes 2M and 20M for a mark in a plane view of the main surface 1S of the substrate 1 have dimensions of approximately 1 μm or more which easily generate the concave portion in the conventional semiconductor device 101P, remarkable effects can be produced by the semiconductor device 101 and the like.

While the interlayer insulating films 2 and 20 have been formed on the main surface 1S of the substrate 1 in the above description, the semiconductor device 104 in the state of FIG. 9 can be regarded as a "substrate" in the case in which layers equivalent to the interlayer insulating film 20, the polysilicon layers 10 and 11, the hole 20M for a mark, the metal layer 37M and the like are further formed on the interlayer insulating film 4 of the semiconductor device 104 shown in FIG. 9, for example.

Moreover, while the case in which the opening entrances of the holes 2M and 20M for a mark are square-shaped has been described above, the same description is appropriate even if the opening entrance of the hole for a mark has a "+" shape or the like, for example.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a substrate having a main surface;
   a first interlayer insulating film provided on said main surface of said substrate;
   a hole for a mark formed in said interlayer insulating film to have an opening entrance formed on a surface of said first interlayer insulating film which is opposite to said substrate;
   a second interlayer insulating film provided to cover said hole for a mark and having a concave portion opened on a surface opposite to said substrate above said hole for a mark; and
   a dielectric layer provided in said concave portion of said second interlayer insulating film, and wherein the dielectric layer does not include a slurry.

2. The semiconductor device according to claim 1, wherein said concave portion of said second interlayer insulating film is filled with said dielectric layer up to the vicinity of said surface of said second interlayer insulating film.

3. The semiconductor device according to claim 1, wherein said dielectric layer is provided on at least an inner surface of said concave portion of said second interlayer insulating film.

4. The semiconductor device according to claim 1, wherein said dielectric layer is formed of a material to which a slurry to be used for a CMP method sticks with more difficulty than said second interlayer insulating film.

5. The semiconductor device according to claim 1, wherein said hole for a mark has a dimension of approximately 1 μm or more as seen from above said main surface of said substrate.

* * * * *